United States Patent [19]

Masaki

[11] Patent Number: 5,428,826
[45] Date of Patent: Jun. 27, 1995

[54] HIGH-SPEED SCANNING RADIO RECEIVER

[75] Inventor: Tateo Masaki, Chiba, Japan
[73] Assignee: Uniden Corporation, Chiba, Japan
[21] Appl. No.: 218,942
[22] Filed: Mar. 29, 1994
[30] Foreign Application Priority Data
    Oct. 8, 1993 [JP] Japan .................. 5-252744
[51] Int. Cl.6 ............................. H04B 1/16
[52] U.S. Cl. .................. 455/161.2; 455/161.3; 455/165.1
[58] Field of Search ............ 455/161.1, 161.2, 161.3, 455/165.1, 164.1, 164.2, 181.1, 182.2, 182.3, 183.1, 183.2, 184.1, 212, 218, 222, 226.1, 226.2, 62, 63, 67.1, 296, 260

[56] References Cited

U.S. PATENT DOCUMENTS

| | | | |
|---|---|---|---|
| 4,580,285 | 4/1986 | Richards, Jr. | 455/161.3 |
| 5,125,105 | 6/1992 | Kennedy et al. | 455/226.2 |
| 5,161,253 | 11/1992 | Hirano | 455/161.3 |
| 5,199,109 | 3/1993 | Baker . | |
| 5,212,817 | 5/1993 | Atkinson | 455/161.2 |

FOREIGN PATENT DOCUMENTS 5-67984  3/1993  Japan .

*Primary Examiner*—Reinhard J. Eisenzopf
*Assistant Examiner*—Nguyen Vo
*Attorney, Agent, or Firm*—Fish & Richardson

[57] ABSTRACT

An automatic tuning system in a high-speed scanning radio receiver provided with (a) a noise squelch circuit, first and second detecting circuits, first and second control circuits, a CPU circuit providing PLL data, and a scanning stop function. The squelch circuit generates a first (SP) signal when a decreasing trend in a noise detection voltage becomes lower than a preset reference voltage. The first detecting circuit judges whether or not the SP signal is generated within first predetermined time period (M1). The first control circuit causes the second detecting circuit to detect whether or not the SC signal is generated within a second predetermined time period (M2; M2>M1) when the first detecting circuit detects the SP signal has been generated, and the second control circuit causes the second detecting circuit to detect whether or not the SC signal is generated within a third predetermined time period (M3; M3>M1) when the first detecting circuit detects the SP signal for the current channel being scanned has not been generated and the SP signal for the preceeding scanning was generated. Accordingly, even if no SP signal for the current channel being scanned has been detected, the system is capable of securely detecting the SC signal by extending a SC signal monitoring period to the period M3, and thus securely stopping searching whenever the SC signal is generated.

11 Claims, 10 Drawing Sheets

Fig. 3(a)
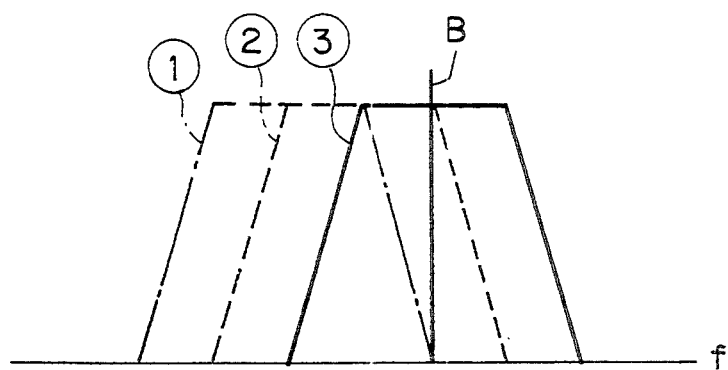
Fig. 3(b)
NOISE DETECTION VOLTAGE
Fig. 3(c)
SP SIGNAL
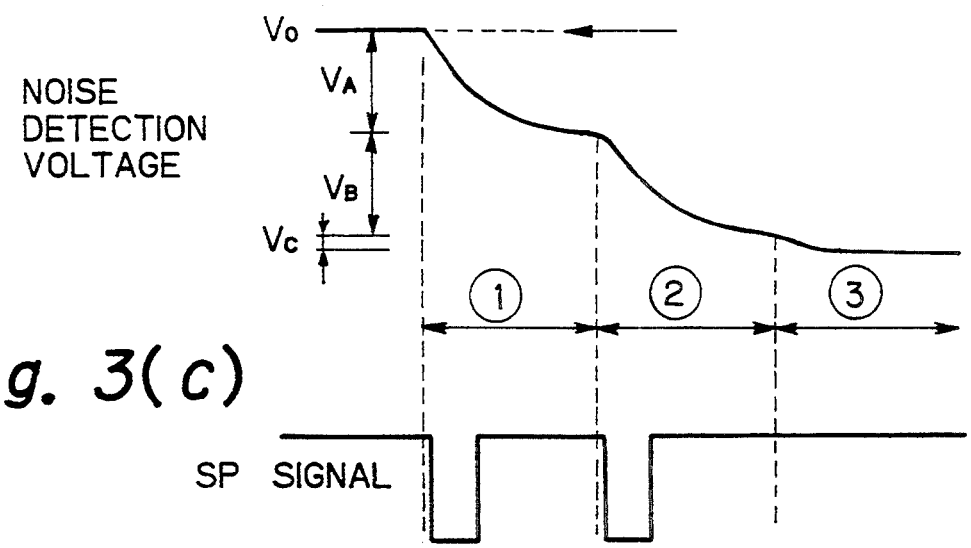

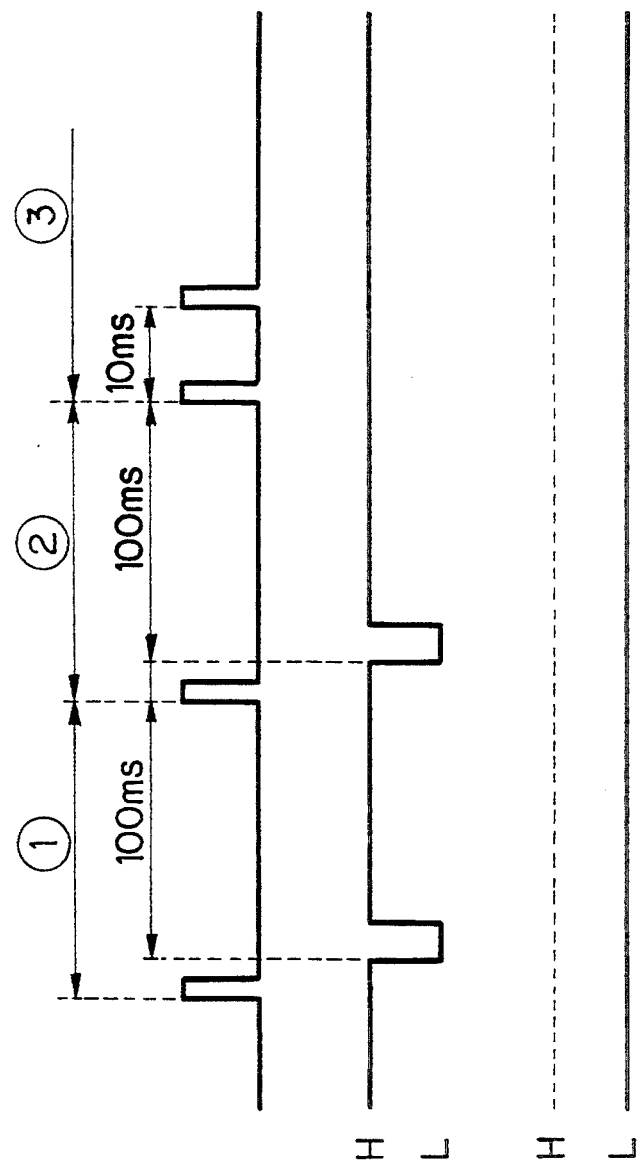

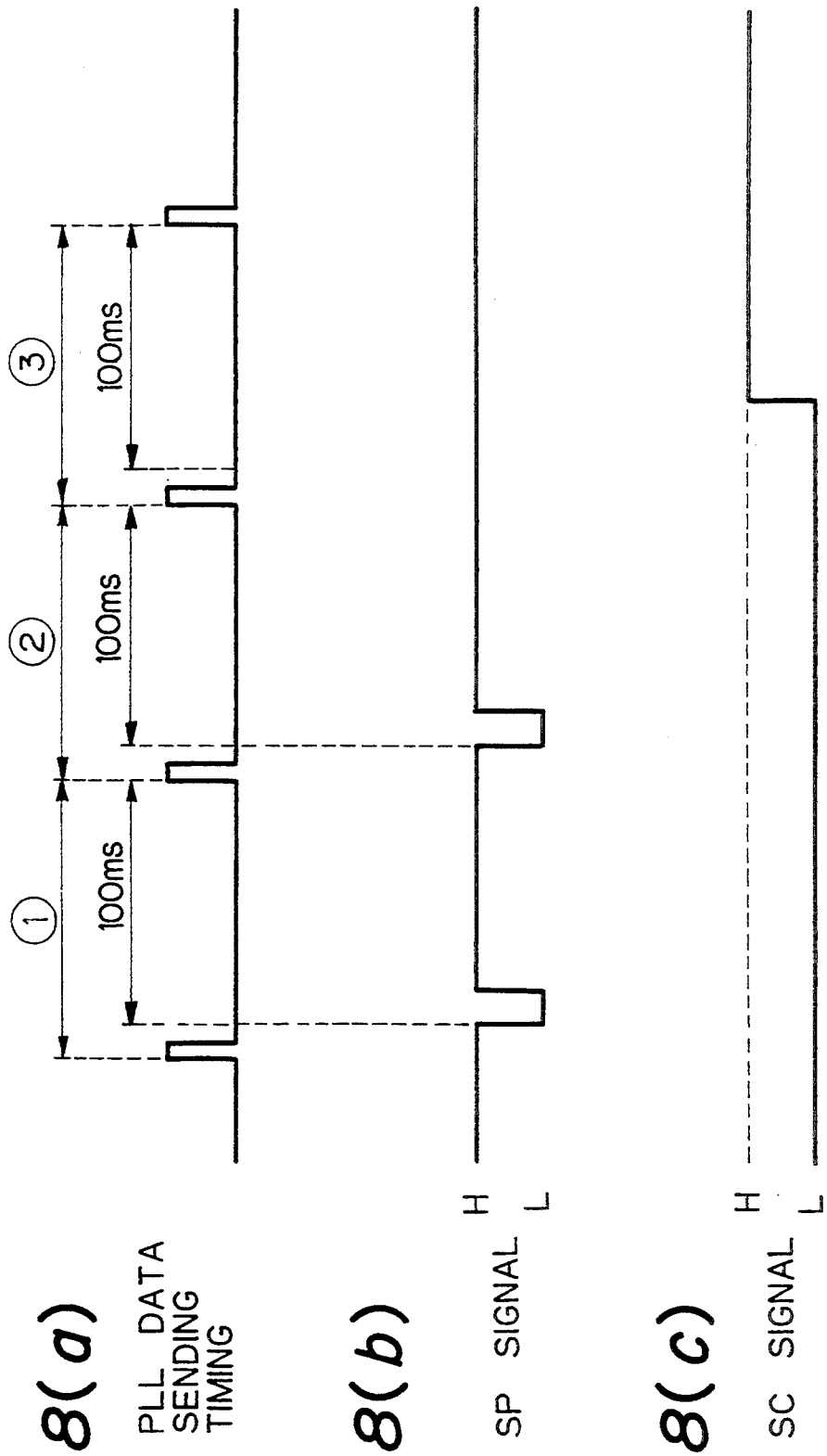

HIGH-SPEED SCANNING RADIO RECEIVER

BACKGROUND OF THE INVENTION

1. Field of the Invention

The present invention relates to a high-speed scanning radio receiver, and, more particularly, to an automatic scanning system and method for a radio receiver.

2. Description of the Prior Art

A noise squelch circuit for detecting the presence or absence of an audio signal is used in an FM high-speed scanning radio receiver in which channels are scanned (searched) through an electronic tuning circuit employing a frequency synthesizing technique.

FIG. 1 is a block diagram showing a basic construction of the FM high-speed scanning radio receiver according to a prior art in which reference numeral 10 denotes a reception antenna, reference numeral 12 a radio receiving unit, reference numeral 14 a frequency discriminator, reference numeral 16 a noise squelch circuit, reference numeral 18 a low-frequency amplifier reference numeral 20 a speaker, reference numeral 22 a window detector, reference numeral 24 a frequency synthesizer, reference numeral 26 a CPU, and reference numeral 28 a keyboard.

In the prior art radio receiver, the noise squelch circuit 16 detects a noise level as a noise detection voltage and compares the noise detection voltage with a reference voltage $V_{TH}$ set by a squelch control provided therein during a channel scanning. When the noise detection voltage becomes lower than the preset reference voltage $V_{TH}$ as shown in FIG. 2(a), the noise squelch circuit 16 generates a squelch signal (hereinafter, referred to as an SC signal) to the CPU 26. When the CPU 26 receives the SC signal, the CPU recognizes that an audio signal has been received in a channel presently scanned and stops the channel scanning. In the radio receiver, since the response characteristic of the noise squelch circuit is not so fast, the SC signal is not generated immediately when the audio signal is received in the current channel, and thus there has been a problem in that it takes a long time to perform searching.

In order to solve the above problem, an improvement has been provided, wherein a signal (hereinafter, referred to as an SP signal) is generated by the noise squelch circuit when a decreasing trend (a portion A circled by a dotted line shown in FIG. 2(b)) is found in the noise detection voltage, and this SP signal is used together with the SC signal to detect the presence or absence of the audio signal. In other words, only when the SP signal is generated and detected in connection with a certain channel, the CPU searches for a predetermined period of time (for example 100 ms) to try to determine whether or not the SC signal regarding the channel is generated, while if no SP signal is detected, the scanning is shifted to the next channel after confirming that no SC signal is generated. Thus as a whole, a high-speed scanning can be attained.

Hereinafter, a scanning system performing the above scanning manner is referred to as a turbo scanning system. The basic idea of the turbo scanning system is disclosed in U.S. Pat. No. 5,199,109 entitled "MULTI CHANNEL SCANNING RECEIVER WITH IMPROVED SIGNAL STRENGTH DETECTION CIRCUITRY." The U.S. Patent is referred to herein.

In the prior art turbo scanning system, since a change in the noise detection voltage is monitored at the noise squelch circuit, when a change in voltage is small, there is a possibility that no SP signal is generated. FIGS. 3(a)-3(c) illustrate such a situation as above. FIG. 3(a) shows the relationship between reception bands ①, ②, ③ of channels sequentially scanned wherein the reception band ③ includes the central frequency of a signal B to be tuned by the radio receiver, FIG. 3(b) shows a change in the noise detection voltage detected in the noise squelch circuit when the reception bands are scanned in order ①, ②, and ③, and FIG. 3(c) shows a SP signal which may be generated from the noise squelch circuit in response to the noise detection voltage shown in FIG. 3(b).

As illustrated in FIG. 3(b), in the reception band ①, the noise detection voltage varies by $V_A$ from $V_O$ which is the voltage in case that there is no audio signal. Since the voltage change $V_A$ is large enough, the SP signal which is a pulse is developed at the noise squelch circuit as shown in FIG. 3(c). In the reception band ②, the noise detection voltage changes by $V_B$ from $V_O$-$V_A$, and then the SP signal pulse is generated again because the voltage change is also large enough. In the reception band ③, the frequency of the signal B is contained in the center thereof to which the receiver must be tuned. Since the amount of change value $V_C$ of the noise detection voltage is substantially small in comparison with $V_A$ and $V_B$, there is generated no SP signal. When no SP signal is generated, searching will be shifted to the succeeding channel, resulting in a failure in tuning.

With reference to FIG. 4, including FIGS. 4(a) and 4(b) showing a processing flowchart to be executed at the prior art turbo scanning system in the conventional high-speed scanning radio receiver having the constitution as shown in FIG. 1, the above tuning situation will now be described in detail below.

In the turbo scanning operation, the CPU 26 controls a PLL-LOCK detection timer incorporated therein to start counting at step S1 and judges at step S2 whether or not a PLL circuit of the frequency synthesizer 24 is locked. If no PLL locking is detected and the PLL-LOCK detection timer has not timed out yet (step S3), the processing flow returns to step S2, while if the PLL locking is detected at step S2 within a predetermined time period preset at the PLL-LOCK detection timer, the CPU 26 causes a SP signal detection timer incorporated therein to start counting at step S4 and it is determined at step S5 whether or not the SP signal is detected within a SP detection waiting time period of 10 ms preset at the SP signal detection timer. If there is detected no SP signal and the SP signal detection timer has not timed out yet (step S6), the flow returns to Step S5.

If the SP signal is detected at step S5, the CPU 26 controls a SC signal detection timer incorporated therein to start counting at step S7 and the CPU judges at step S8 whether or not the SC signal is generated within a SC detection waiting time period of 100 ms preset at the SC signal detection timer. If there is detected no SC signal and the SC signal detection timer has not timed out yet (step S9), the flow returns to step S8. If the SC signal is detected at step S8, the CPU 26 detects at step S10 whether or not a window signal (hereinafter, referred to as a WD signal) from the window detector 22 is generated. If the WD signal is detected, the flow returns to step S8, and if not, the CPU supplies PLL data of the next channel to the frequency synthesizer 24 at step S11.

In addition, if the PLL-LOCK and SP detection timers are determined to have timed out respectively at steps S3 and S6, a further check, or whether or not the SC signal is generated, is performed at step S12 to make sure that no SC signal has been generated. If the SC signal has been generated, the flow proceeds to step S7, while if not, the flow proceeds to step S11.

Although the processing flow in general has been described as above, below is given a concrete description of an operation of the CPU when the noise detection voltage changes as shown in FIG. 3(b). FIGS. 5(a)-5(c) respectively represent timing charts of PLL data sending timing, the SP signal, and the SC signal. These timing charts will also be referred to, together with the flowchart shown in FIGS. 4(a) and 4(b).

When the PLL data of a channel corresponding to the reception band ① is sent from the CPU 26 to the frequency synthesizer 24 at step S11, the PLL-LOCK detection timer is controlled to start counting at step S1. If the PLL locking is detected at step S2, the SP signal detection timer is controlled to start counting at step S4 and the detection of the SP signal is carried out for 10 ms at step S5. Since the SP signal is generated in the reception band ① as shown in FIG. 5(b) (and FIG. 3(c)), when the SP signal is detected, the SC signal detection timer is controlled to start counting at step S7, the detection of the SC signal is carried out for 100 ms at step S8. In this case, since there is generated no SC signal as shown in FIG. 5(c), when the SC signal detection timer times out (step S9), the PLL data of the channel corresponding to the next reception band ② is provided to the frequency synthesizer 24 at step S11.

Accordingly, the detection of the SP signal is then carried out for 10 ms after the PLL locking is detected (steps S1-S5). Since there is also generated the SP signal in the reception band ② as shown in FIG. 5(b) (and FIG. 3(c)), when the SP signal is detected, the SC signal detection timer is controlled to start counting at step S7, and the detection of the SC signal is performed for 100 ms (step S8). In this case, since there is generated no SC signal as shown in FIG. 5(c), when the SC signal detection timer times out (step S9), the PLL data of the channel corresponding to the reception band ③ is provided to the frequency synthesizer 24 from the CPU 26 at step S11, and the detection of the SP signal is conducted for 10 ms after the PLL locking is detected (steps S1-S5). In this case, since there is generated no SP signal as shown in FIG. 5(b) (and FIG. 3(c)), no SP signal is detected at step S5, and thus after the SP signal detection timer times out (step S6), by way of precaution, it is checked whether or not the SC signal has been generated at step S12. In this case, since there is generated no SC signal as shown in FIG. 5(c), the PLL data of the succeeding channel is sent to the frequency synthesizer 24 at step S11, thereby the scanning is then shifted to the following channel.

As described above, in the prior art turbo scanning system, the SC signal detection waiting time period of 10 ms is extended to 100 ms only for the channel where the SP signal is generated or the SC signal is generated, provided that no SP signal has been generated within the SP signal detection waiting time period. On the other hand, if there is detected neither the SP signal during the SP signal detection waiting time period nor SC signal is detected, the channel scanning is shifted to the next channel substantially after the SP signal waiting time period has elapsed. Therefore, in a case where the SC signal is generated after the SP signal detection waiting time period has elapsed, it is not possible to stop searching, thus resulting in a failure in tuning.

SUMMARY OF THE INVENTION

Accordingly, an object of the present invention is to provide an automatic tuning system and method in a high-speed scanning radio receiver capable of solving the problem as described above to securely stop a searching operation whenever an SC signal is generated from a noise squelch circuit of the radio receiver.

In order to achieve the object of the present invention, an automatic tuning system in a high-speed scanning radio receiver according to the present invention comprises: (a) a noise squelch circuit for generating a first (SP) signal when a decreasing trend of a noise detection voltage representing an amplitude of noises included in a received signal is detected and a second (SC) signal when said noise detection voltage becomes lower than a preset reference voltage; (b) first detecting means for detecting within a first predetermined time period (M1) in a cycle of scanning each channel whether or not said first signal is generated by said noise squelch circuit; (c) second detecting means for detecting within a selected one of second and third predetermined time periods (M2 and M3) in said cycle whether or not said second signal is generated by said noise squelch circuit, said second and third predetermined time periods being longer than said first predetermined time period; (d) first control means for causing said second detecting means to detect the generation of said second signal for the current channel within said second predetermined time period when said first detecting means detects that said first signal for the current channel has been generated; (e) second control means for causing said second detecting means to detect the generation of said second signal for at least the current channel within said third predetermined time period when said first detecting means detects that said first signal for the preceeding channel was generated and said first signal for the current channel has not been generated; (f) PLL data providing means for providing PLL data for the next channel to a frequency synthesizer when said second detecting means detects that said second signal for the current channel has not been generated; and (g) stopping means for stopping the channel scanning when said second detecting means detects that said second signal for the current channel has been generated.

The subject invention further relates to a method of performing automatic tuning by scanning channels in a high-speed scanning radio receiver comprising the steps of: (a) generating a first signal when a decreasing trend of a noise detection voltage representing an amplitude of noises included in a received signal is detected; (b) generating a second signal when said noise detection voltage becomes lower than a preset reference voltage; (c) detecting within a first predetermined time period in a cycle of scanning each channel whether or not said first signal is generated; (d) detecting within a second predetermined time period in said cycle whether or not said second signal for the current channel is generated when said first detecting means detects that said first signal for the current channel has been generated, said second time period being longer than said first predetermined time period; (e) detecting within a third predetermined time period in said cycle whether or not said second signal for at least the current channel is generated when said first detecting means detects that said first signal for the preceeding channel was generated and said first signal for the current channel has not been generated within said first predetermined time period, said third predetermined time period being longer than said first predetermined time period; (f) providing PLL data for the next channel to a frequency synthesizer when it is detected that said second signal for the current channel has not been generated within said second or third predetermined time period; and (g) stopping the channel scanning when it is detected that said second signal for the current channel has been generated within said second or third predetermined time period.

Accordingly, in the present invention, the time period for monitoring the SC signal can be extended to the time period (M3) even if no SP signal for the current channel is generated but the SP signal for the preceeding channel is generated, and thus the generation of the SC signal can be securely detected, resulting in no failure in tuning or searching.

BRIEF DESCRIPTION OF THE DRAWINGS

FIGS. 3(a)-3(c) illustrate a condition where three frequency bands respectively corresponding to succeeding channels overlap to each other and thus no SP signal is generated from a noise squelch circuit of the prior art radio receiver even if a scanning channel includes an audio signal to be tuned;

FIG. 4 is made up of FIG. 4(a) and FIG. 4(b).

FIGS. 5(a)-5(c) are timing charts respectively showing PLL data supply timing, and SP and SC signal generation timings;

FIG. 7 is made up of FIG. 7(a) and 7(b).

FIGS. 8(a)-8(c) are timing charts respectively showing PLL data supply timing, and SP and SC signal generation timings according to the present invention.

DESCRIPTION OF THE PREFERRED EMBODIMENTS

Figure 1:
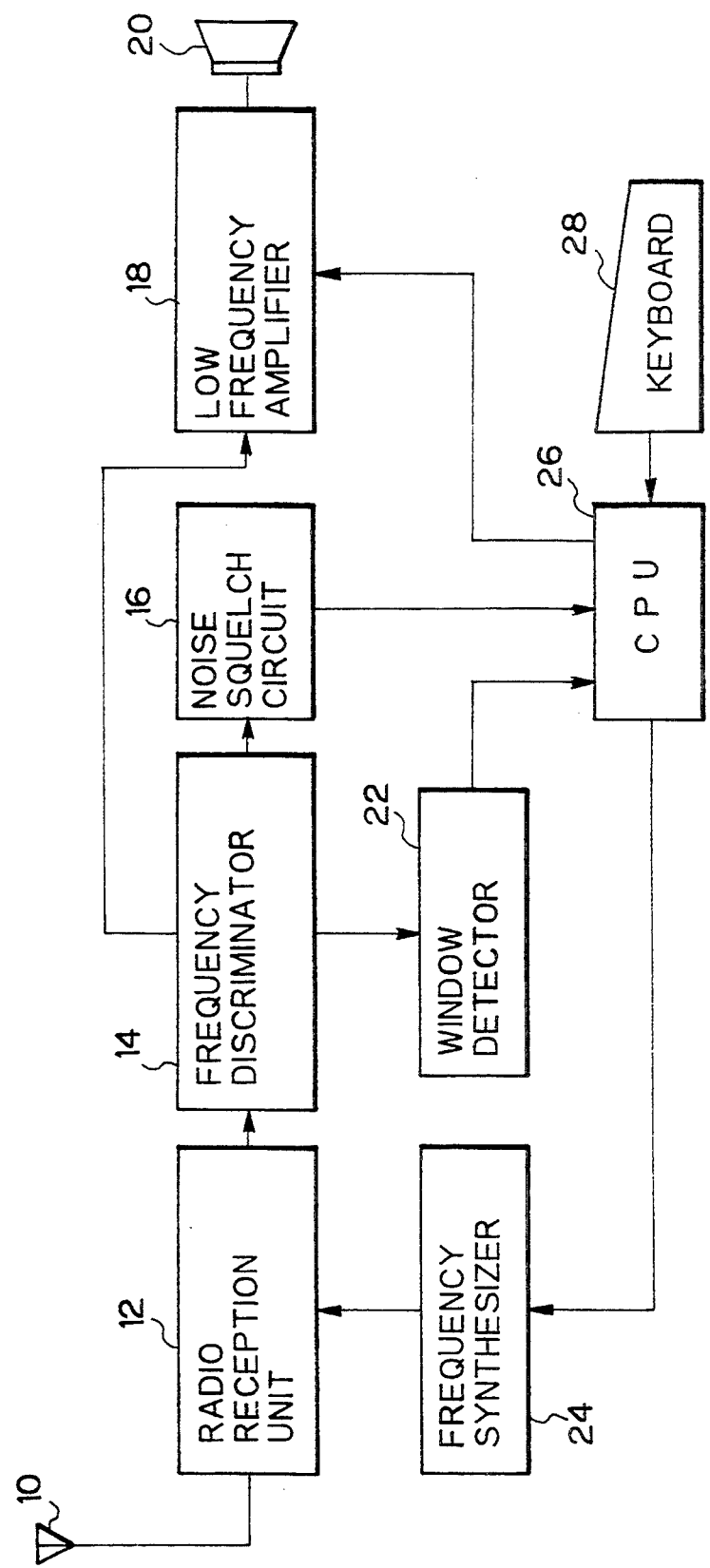
FIG. 1 is a block diagram showing a basic construction of a conventional FM high-speed scanning radio receiver.
Figure 2A:
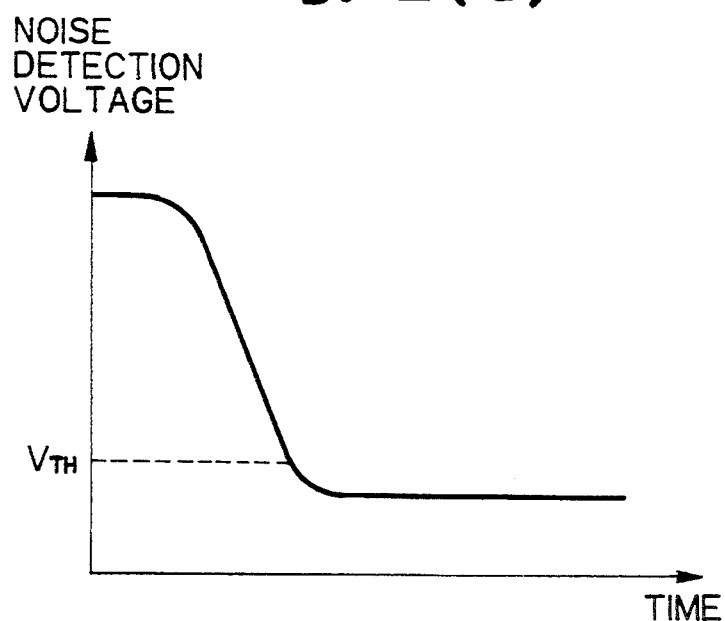
FIGS. 2(a) and 2(b) show a wave form of a noise detection voltage for explaining a generation of a squelch (SC) signal and a decreasing trend detection (SP) signal utilizing in the prior art radio receiver.
Figure 2B:
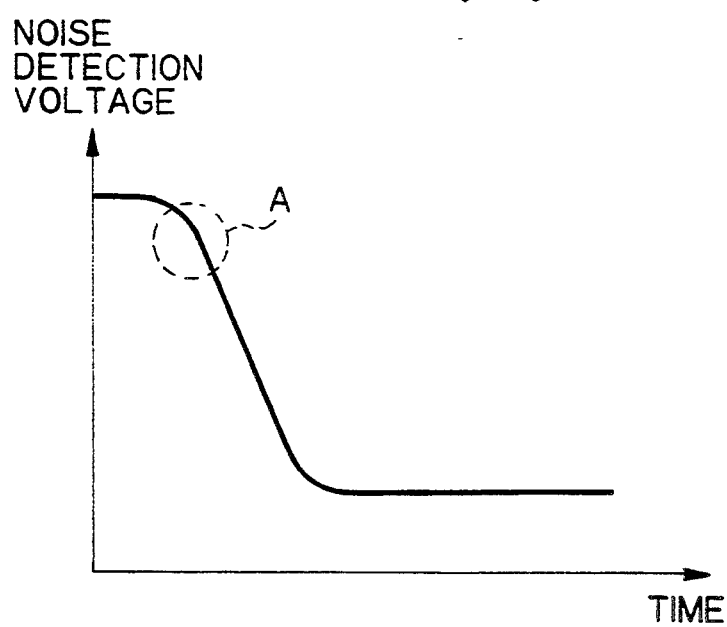
Figure 4A:
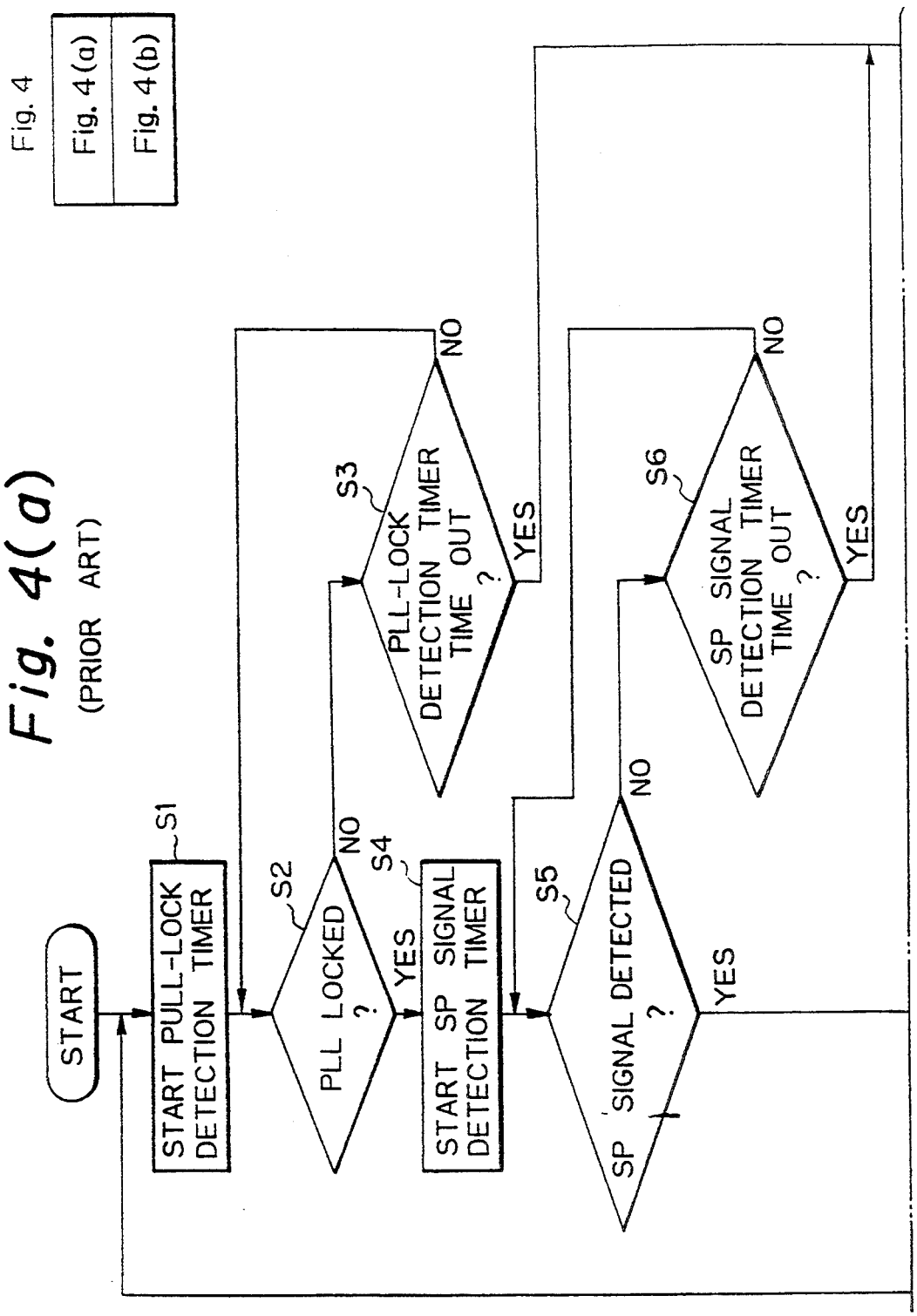
FIGS. 4(a) and 4(b) show a processing flowchart performed in a CPU of the prior art radio receiver.
Figure 4B:
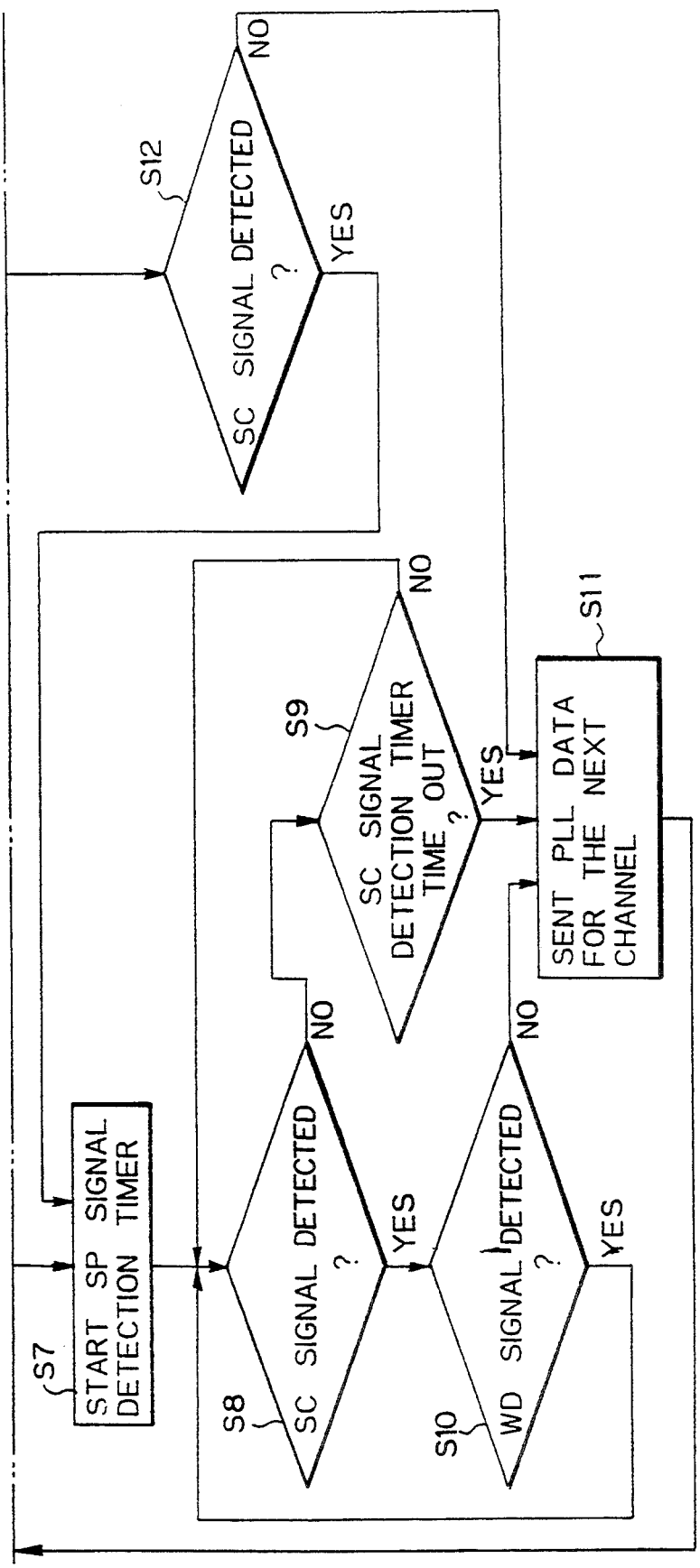

An embodiment of a high-speed scanning radio receiver utilizing a turbo scanning system of the present invention will be explained by referring to FIGS. 6, 7, including 7(a), 7(b), and 8(a)-8(c). Since a basic construction of the radio receiver of the present invention is the same as that of the prior art shown in FIG. 1, FIG. 1 is also referred to in the following description.

Figure 6:
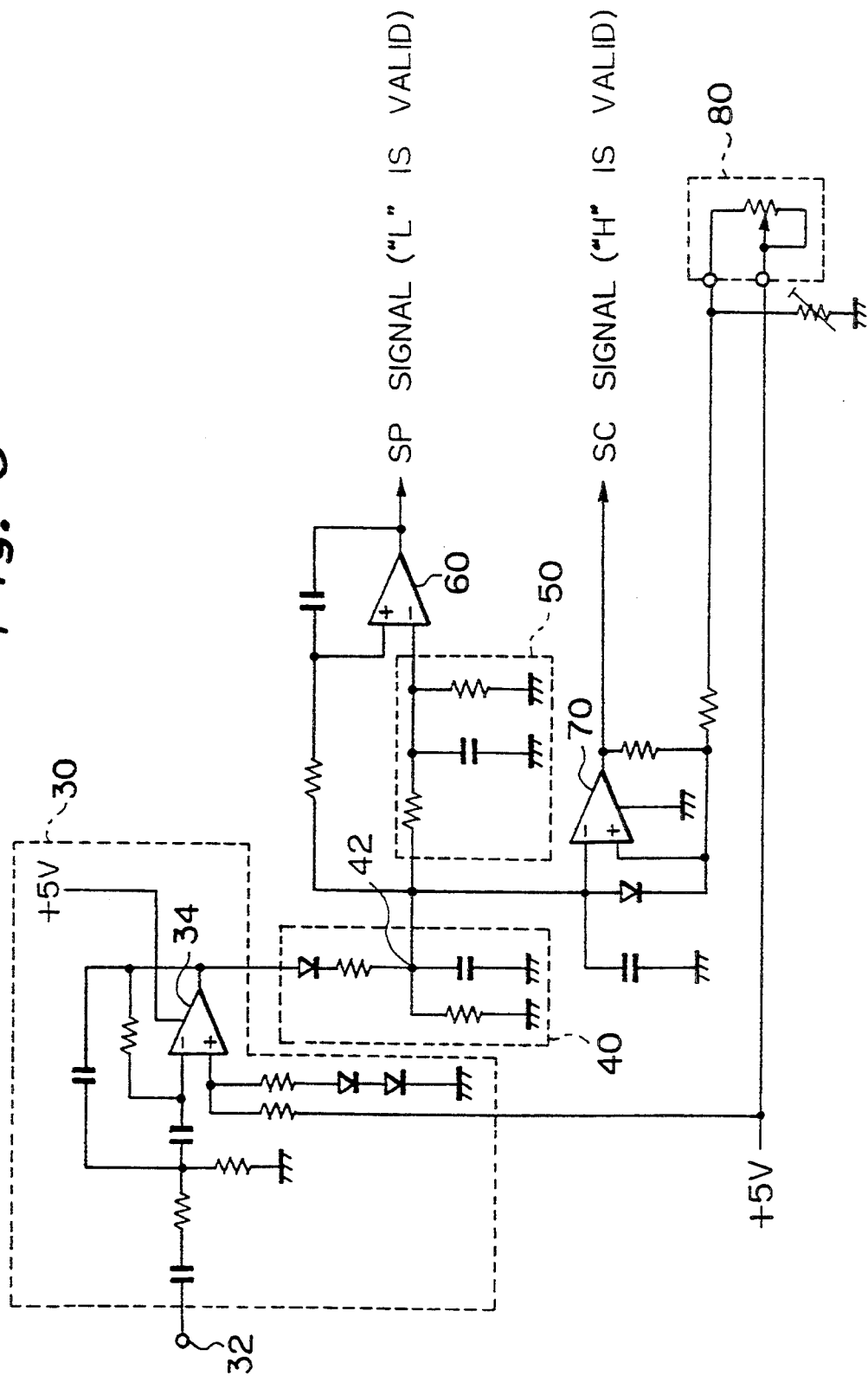
FIG. 6 is a diagram showing a construction of a noise squelch circuit for use in a high-speed scanning radio receiver according to the present invention.

In the present invention, the constitution of the noise squelch circuit 26 differs from that of the prior art and is shown in FIG. 6. The noise squelch circuit comprises a high-pass filter 30 for passing through noise signals in a signal output from the frequency discriminator 14, a noise detector 40 for detecting a level of the noise signal output from the high-pass filter 30 and outputting a noise detection voltage signal, an integrator 50, a comparator 60 for generating a SP signal, a comparator 70 for generating an SC signal, and a squelch control 80.

An input terminal 32 of the high-pass filter 30 is connected to the frequency discriminator 14, and the noise signal is output from an output terminal of an operational amplifier 34. This noise signal is supplied to the noise detector 40 to detect the noise level. The detected noise level, that is the noise detection voltage signal, is output from a node 42 to a non-inverted (+) input terminal of the comparator 60 through a resistor and to the integrator 50. The noise detection voltage signal is also provided to an inverted (−) input terminal of the comparator 70.

The integrator 50 acts as a delay means for delaying the noise detection voltage signal, and the delayed noise detection voltage signal from the integrator 50 is then provided to an inverted (−) input terminal of the comparator 60.

The comparator 60 compares the noise detection voltage signal with the delayed one from the integrator 50 and generates an SP signal which is a pulse of a logic level "L" when the noise detection voltage signal is found to be smaller than the delayed one.

The (−) input terminal of the comparator 70 receives the noise detection voltage signal from the noise detector 40, as already mentioned, and the (+) input terminal thereof receives a reference voltage preset at the squelch control 80 comprising a variable resistor 82. The comparator 70 then compares these voltages and changes its output level so that a SC signal of a logic "H" is generated when the noise detection voltage is smaller than the preset reference voltage from the squelch control 80.

The SP and SC signals generated from the noise squelch circuit 16 as explained above are sent to the CPU 26.

Figure 7A:
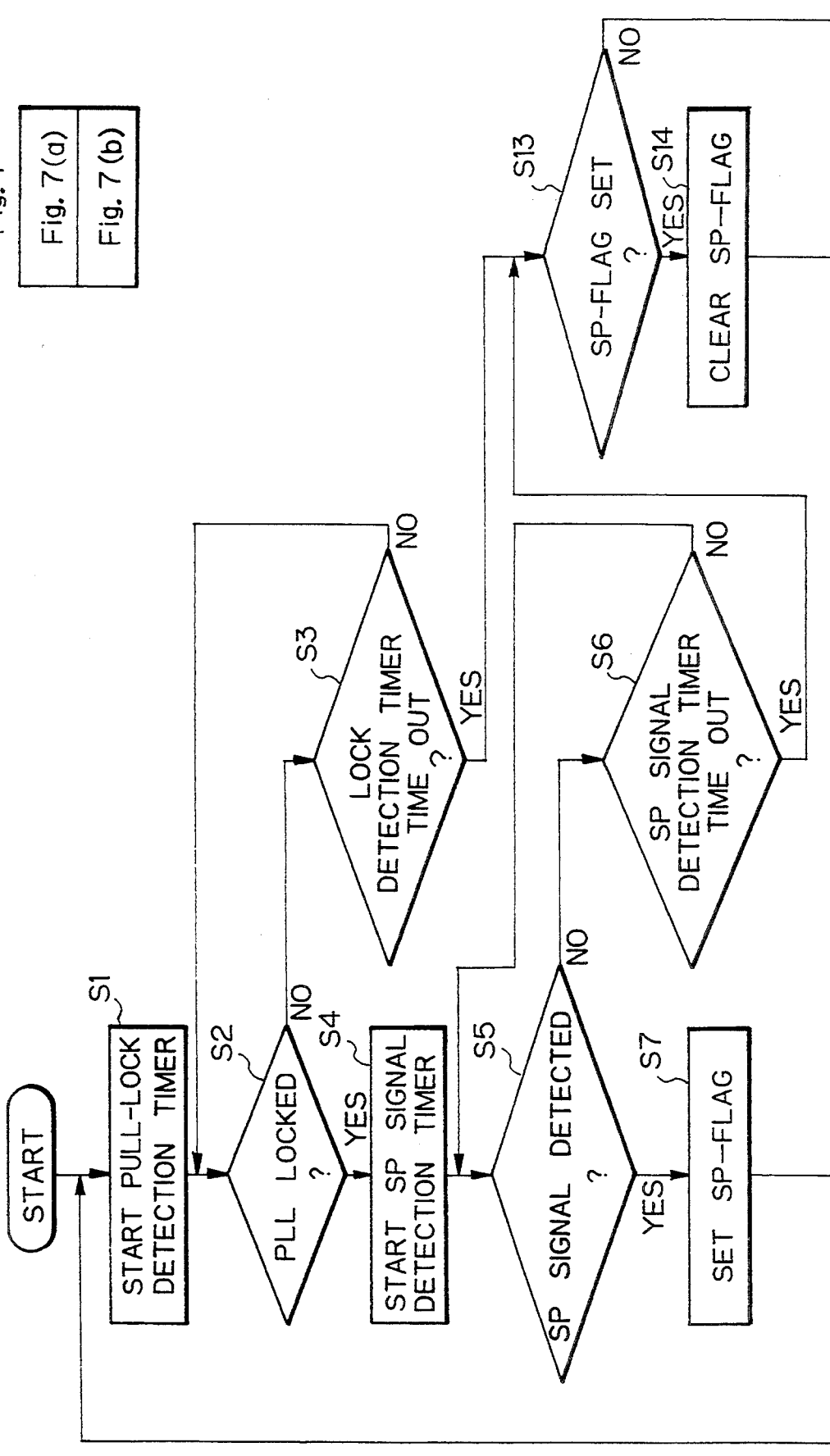
FIGS. 7(a) and 7(b) show a processing flowchart performed by a CPU of the radio receiver according to the present invention.
Figure 7B:
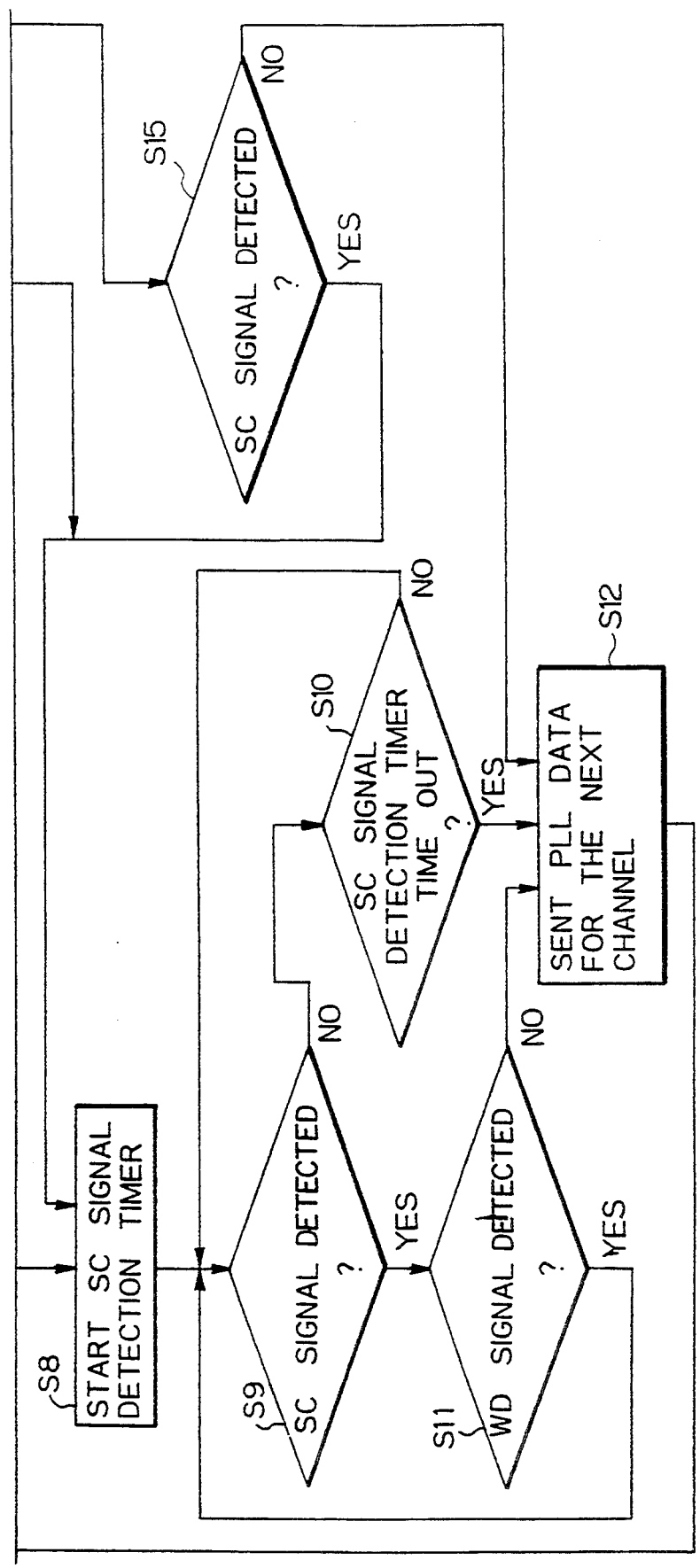

Referring to FIGS. 7(a) and 7(b), an operation of the CPU 26 will next be described. The CPU 26 renders a PLL-LOCK detection timer incorporated therein to start counting at step S1 and judges at step S2 whether or not a PLL circuit of the frequency synthesizer 24 is locked. If no PLL locking is detected and the PLL-LOCK detection timer has not timed out yet (step S3), the flow returns to step S2. When the PLL locking is detected at step S2, an SP signal detection timer incorporated in the CPU 26 is controlled to start counting at step S4, and whether or not the SP signal is generated from the noise squelch circuit 16 is judged at step S5. If there is detected no SP signal and the SP signal detection timer has not timed out (step S6), the flow returns to the step S5, and thus the judgement at step S5 is executed within a detection waiting time period of 10 ms preset at the SP signal detection timer. When the SP signal is detected at step S5, a flag (SP-FLAG) indicating that the SP signal has been detected is set at step S7.

Next, an SC signal detection timer which is also incorporated in the CPU 26 is caused to start counting at step S8, and it is examined at step S9 whether or not the SC signal is generated from the noise squelch circuit 16. If there is detected no SC signal and the SC signal detection timer has not timed out (step S10), the flow returns to step S9. Accordingly, the detection of the SC signal at step S9 continues within a SC signal detection waiting time period of 100 ms preset at the SC signal detection timer. When the SC signal is detected at the step S9, it is detected whether or not the window detector 22 (FIG. 1) generates a WD signal at step S11. If the WD signal is detected, the flow returns to step S9, while if there is detected no WD signal, the PLL data of the next channel is sent to the frequency synthesizer 24 at step S12.

In contrast, if the SP and SC signal detection timers, respectively, generate time-up signals at steps S3 and S6, whether or not the SP-FLAG has been set (step S7) is judged at step S13. If the SP-FLAG is found to have been set, it is cleared at step S14, and the flow then proceeds to step S8. If the SP-FLAG is found not to have been set at step S13, to make sure, generation of the SC signal is checked at step S15. If the SC signal is found to have been generated, the flow proceeds to step S8, while if there is generated no SC signal, the PLL data for the next channel is sent from the CPU 26 to the frequency synthesizer 24 at step S12.

After the generation of the SC signal has been detected at step S15, the SC signal is detected again at step S9 in the processing flow as shown in FIG. 7(b). This is because there is a possibility that the high level of the SC signal may not be maintained immediately after the SP signal detection timer has timed out, and thus the detection of the SC signal is performed again at step S9 to obtain an accurate detection of the SC signal. However, it is possible for the YES branch of step S15 to directly proceed to step S11, if fluctuation of the SC signal is low enough.

The above is a general description of the processing operation of the CPU 26, and described below will be a concrete description of an operation of the CPU in the case where the noise detection voltage changes as shown in FIG. 3(b).

FIGS. 8(a)–8(c) illustrate relationships between a sending timing of the PLL data from the CPU 26, and the SP and SC signals. When the PLL data of the channel corresponding to the reception band ① is sent from the CPU 26 to the frequency synthesizer 24 at step S11, the PLL-LOCK detection timer is controlled to start counting at step S1. Accordingly, the sending timing of the PLL data shown in FIG. 8(a) is substantially the same as the start timing of the PLL-LOCK detection timer. If the PLL locking is detected at step S2, the SP signal detection timer is caused to start counting at step S4, and the detection of the SP signal is carried out for 10 ms (steps S5 and S6). Since the SP signal is generated regarding the reception band ① as shown in FIG. 8(a), after SP-FALG is set at step S7, the SC signal detection timer is controlled to start counting at step S8 and the detection of the SC signal is carried out for 100 ms (steps S9 and S10). In this case, since there is generated no SC signal as shown in FIG. 8(c), when the SC signal detection timer times out (step S10), the PLL data of the channel corresponding to the next reception band ② is provided to the frequency synthesizer 24 at step S12.

Therefore, the scanning is shifted to the next channel, and the detection of the SC signal for the reception band ② is performed for 10 ms after the PLL locking has been detected (steps S1–S5). Since the SP signal relating to the reception band ② is generated as shown in FIG. 8(b), the SP-FLAG is set again at step S7, and the SC signal detection timer is controlled to start counting at step S8. The detection of the SC signal is carried out for 100 ms (steps S9 and S10). In this case, since there is generated no SC signal as illustrated in FIG. 8(c), when the SC signal detection timer times out (step S10), the PLL data of the channel corresponding to the next reception band ③ is supplied to the frequency synthesizer 24 at step S12, and then the processing operation is returned to step S1.

Therefore, after the PLL locking has been detected, the detection of the SP signal for the reception band ③ is performed for 10 ms (steps S1–S5). With regard to the reception band ③, since there is generated no SP signal as shown in FIG. 8(b), when the SP signal detection timer times out (step S6), the state of the SP-FLAG is examined at step S13. As explained above, the SP-FLAG has been set relating to the reception band ②, and therefore after the flag is cleared or reset at step S14, the SC signal detection timer is controlled to start counting at step S8, and then the detection of the SC signal is carried out for 100 ms (steps S9 and S10). In other words, even if there is generated no SP signal regarding the current channel, when the SP-FLAG has been set (this indicates that the SP signal was detected in the previous channel), the SC signal detection waiting time period will be extended for 100 ms preset at the SC signal detection timer.

Since the reception band ③ includes the signal B to be tuned, the SC signal regarding the reception band ③ is generated, as shown in FIG. 8(c), within the extended time period of 100 ms. Accordingly, whether or not the window detector 22 generates the WD signal is examined at step S11. If it is generated, since it means tuning is successful, the CPU 26 completes the tuning operation. In other words, searching is stopped. If there is generated no SC signal within the extended time period of 100 ms, when the SC signal detection timer generates the time-up signal (step S10), the PLL data for the coming channel is sent to the frequency synthesizer 24, searching is shifted to the coming channel.

In FIGS. 7(a) and 7(b), the flow shows that when the WD signal has been detected at step S11, the detection of the SC signal is executed again at step S9. This is for starting the searching again from step S9 when a radio signal of a desired channel disappears during a reproduction of the radio signal. Accordingly, if the disappearance of the radio signal is within the predetermined time period preset at the SC signal detection timer, the radio signal of the desired channel will be reproduced immediately when the radio signal is recovered. It is a matter of course that the YES branch from step S11 may proceeds to an END block not shown.

As is described above, according to the embodiment of the present invention, even if there is detected no SP signal, it is possible to extend the SC signal detection waiting time period when the SP-FLAG is has been set, which means that the SP signal relating to the last scanning channel was generated. Accordingly, if there is generated an SC signal within this extended period of time, searching can securely be stopped.

In the above embodiment, the SC signal detection waiting time period is extended only for one channel succeeding to a SP signal detected channel. It will be appreciated that the present invention is not limited to the foregoing, but that such an extension of the SC signal detection waiting time period may be provided for a number of scanning channels following to the SP signal detected channel. This can easily be realized by utilizing a counter.

Moreover, in the above embodiment, the SC signal detection waiting timer counts the SC signal waiting time period in both cases; one is when the SP-FLAG has been set and no SP signal for the current channel is detected, and the other is when the SP signal for the current channel is detected. Accordingly, the SC signal waiting time periods in the both cases are the same. It will be easy to set separate waiting time periods for the respective SC signal detections by using separate timers or by setting different time periods at the same timer depending on the above cases. Furthermore, it is obvious to set the SP and SC signal detection waiting time periods other than 10 ms and 100 ms, respectively.

As is described above, according to the high-speed scanning radio receiver using the turbo scanning system of the present invention, even if there is generated no SP signal for a channel to be tuned, due to a small fluctuation in noise detection voltage, the SC signal generated within a period of time so extended can be detected and thus searching can be securely stopped.

It will be understood that modifications and variations may be effected without departing from the spirit and scope of the present invention.

What is claimed is:

1. A system performing automatic tuning by scanning channels in a high-speed scanning radio receiver comprising:

a noise squelch circuit for generating a first signal when a decreasing trend of a noise detection voltage representing an amplitude of noises included in a received signal is detected and a second signal when said noise detection voltage becomes lower than a preset reference voltage;

first detecting means coupled to the output of the noise squelch circuit for detecting within a first predetermined time period in a cycle of scanning each channel whether or not said first signal is generated by said noise squelch circuit;

second detecting means for detecting within a selected one of second and third predetermined time period in said cycle whether or not said second signal is generated by said noise squelch circuit, said second and third predetermined time periods being longer than said first predetermined time period;

first control means for causing said second detecting means to detect the generation of said second signal for a current channel being scanned within said second predetermined time period when said first detecting means detects that said first signal for the current channel has been generated;

second control means for causing said second detecting means to detect the generation of said second signal for at least the current channel within said third predetermined time period when said first detecting means detects that said first signal for the preceeding channel was generated and said first signal for the current channel has not been generated;

PLL data providing means for providing PLL data for the next channel to a frequency synthesizer when said second detecting means detects that said second signal for the current channel has not been generated; and stopping means for stopping the channel scanning when said second detecting means detects that said second signal for the current channel has been generated.

2. A system as set forth in claim 1 wherein said second control means includes:

flag setting means for setting a flag when said first detecting means detects that said first signal for the current channel has been generated within said first predetermined time period; and flag reset means for resetting the flag previously set by said flag setting means when said first detecting means detects that said first signal for the current channel has not been generated within said first predetermined time period.

3. A system as set forth in claim 1 wherein said second and third predetermined time periods are the same.

4. A system as set forth in claim 1 wherein said noise squelch circuit comprises:

a noise detector for detecting said noise detection voltage and providing a noise detection voltage signal corresponding thereto;

delay means for delaying said noise detection voltage signal;

a first comparator for comparing said noise detection voltage signal with the delayed noise detection voltage signal and for generating said first signal when said noise detection voltage signal is smaller than the delayed one;

squelch control for generating said preset reference voltage; and a second comparator for comparing said noise detection voltage signal with said preset reference voltage and for generating said second signal when said noise detection voltage signal is lower than said preset reference voltage.

5. A system as set forth in claim 1 wherein said first and second detecting means, said first and second control means, PLL data providing means and stopping means are included in a microprocessor.

6. A method of performing automatic tuning by scanning channels in a high-speed scanning radio receiver comprising the steps of:

generating a first signal when a decreasing trend of a noise detection voltage representing an amplitude of noises included in a received signal is detected;

generating a second signal when said noise detection voltage becomes lower than a preset reference voltage;

detecting within a first predetermined time period in a cycle of scanning each channel whether or not said first signal is generated;

detecting within a second predetermined time period in said cycle whether or not said second signal for a current channel being scanned is generated when said first detecting means detects that said first signal for the current channel has been generated, said second time period being longer than said first predetermined time period;

detecting within a third predetermined time period in said cycle whether or not said second signal for at least the current channel is generated when said first detecting means detects that said first signal for the preceeding channel was generated and said first signal for the current channel has not been generated within said first predetermined time period, said third predetermined time period being longer than said first predetermined time period;

providing PLL data for the next channel to a frequency synthesizer when it is detected that said second signal for the current channel has not been generated within said second or third predetermined time period; and stopping the channel scanning when it is detected that said second signal for the current channel has been generated within said second or third predetermined time period.

7. A method as set forth in claim 6 further comprising:

setting a flag when it is detected that said first signal for the current channel has been generated; and resetting a flag previously set when it is detected that said first signal for the current channel has not been generated within said first predetermined time period.

8. A method as set forth in claim 6 wherein said second and third predetermined time periods are the same.

9. A method as set forth in claim 6 wherein the step of generating said first signal comprises:

detecting said noise detection voltage and providing a noise detection voltage signal corresponding thereto;

delaying said noise detection voltage signal;

comparing said noise detection voltage signal with the delayed noise detection voltage signal; and generating said first signal when said noise detection voltage signal is smaller than the delayed noise detection voltage signal.

10. A method as set forth in claim 6 wherein the step of generating said second signal comprises:

detecting said noise detection voltage and providing a noise detection voltage signal corresponding thereto;

generating said preset reference voltage;

comparing said noise detection voltage signal with said preset reference voltage; and generating said second signal when said noise detection voltage signal is lower than said preset reference voltage.

11. A method as set forth in claim 6 wherein the steps of detecting said first and second signal, controlling the detection of said second signal, providing said PLL data, and stopping the channel scanning are performed by a microprocessor.

* * * * *